(12) United States Patent
Kang et al.

(10) Patent No.: US 8,363,494 B2
(45) Date of Patent: Jan. 29, 2013

(54) SEMICONDUCTOR MEMORY APPARATUS

(75) Inventors: Kyeong Pil Kang, Ichon-shi (KR);
Byoung Kwon Park, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 166 days.

(21) Appl. No.: 12/970,747

(22) Filed: Dec. 16, 2010

(65) Prior Publication Data

US 2012/0106271 A1   May 3, 2012

(30) Foreign Application Priority Data

Oct. 29, 2010   (KR) .................. 10-2010-0106878

(51) Int. Cl.
*G11C 7/00* (2006.01)
(52) U.S. Cl. .................... 365/200; 365/255.7
(58) Field of Classification Search ............. 365/200, 365/225.7, 230.03
See application file for complete search history.

(56) References Cited

U.S. PATENT DOCUMENTS

| | | | |
|---|---|---|---|
| 5,953,270 A | 9/1999 | Kim | |
| 6,104,647 A | 8/2000 | Horiguchi et al. | |
| 6,134,179 A * | 10/2000 | Ooishi | 365/233.14 |
| 6,154,389 A | 11/2000 | Chung et al. | |
| 6,434,064 B2 * | 8/2002 | Nagai | 365/200 |
| 6,522,590 B2 * | 2/2003 | Matsui et al. | 365/200 |

FOREIGN PATENT DOCUMENTS

| | | |
|---|---|---|
| JP | 2004-259338 | 9/2004 |
| JP | 2008-299927 | 12/2008 |
| JP | 2010-129116 | 6/2010 |
| KR | 1020060038808 A | 5/2006 |
| KR | 1020070082815 A | 8/2007 |

\* cited by examiner

*Primary Examiner* — Son Dinh
(74) *Attorney, Agent, or Firm* — William Park & Associates Ltd.

(57) ABSTRACT

Various embodiments of a semiconductor memory apparatus are disclosed. In one exemplary embodiment, the semiconductor memory apparatus may include: a redundancy signal generation unit configured to compare mat information set by fuse cutting with address information inputted from outside and generate a plurality of redundancy signals; a mat designation signal generation unit configured to generate a plurality of mat designation signals in response to the plurality of redundancy signals and a plurality of mat address signals; and a mat control signal generation group configured to enable one of the mat control signals in response to the plurality of mat designation signals.

10 Claims, 4 Drawing Sheets

SEMICONDUCTOR MEMORY APPARATUS

CROSS-REFERENCES TO RELATED APPLICATION

The present application claims priority under 35 U.S.C. §119(a) to Korean Patent Application No. 10-2010-0106878, filed on Oct. 29, 2010, in the Korean Intellectual Property Office, which is incorporated herein by reference in its entirety as if set forth in full.

BACKGROUND

1. Technical Field

The disclosure relates to a semiconductor integrated circuit, and more particularly, to a semiconductor memory apparatus.

2. Related Art

A conventional semiconductor memory apparatus includes a great number of memory cells, and is configured to store data in the memory cells. A conventional semiconductor memory apparatus includes a plurality of mats each of which is a set of memory cells, and is designed in such a manner that an address signal is used to select the location of a mat (memory cells) in which data are to be stored. Furthermore, the semiconductor memory apparatus includes extra mats to replace a mat having a failed memory cell, and is designed in such a manner that when an address signal is inputted to store data in the mat having the failed memory cell, an extra mat is internally selected to store data according to the address signal.

When an address signal is inputted to designate the location of a mat having a failed memory cell, that is, a mat in which a fail occurs, a circuit included in the semiconductor memory apparatus designates the storage location of data in an extra mat instead of the mat in which the fail occurred. Such an operation is referred to as a redundancy operation.

FIG. 1 is an illustration of a conventional semiconductor memory apparatus which includes a redundancy signal generation unit 10 and first to sixteenth mat control signal generation units 101 to 116.

The redundancy signal generation unit 10 has mat information set by fuse cutting, and is configured to compare address information ADDRESS with the mat information and enable one of first to sixteenth redundancy signals XHITB<0:15> to a low level. The fuse cutting information can be address information of a mat in which a fail occurs and which is set by fuse cutting. Furthermore, a mat can be the unit of a data storage area in which data is stored, and the mat information set by fuse cutting is information of a mat in which a fail occurs.

Each of the first to sixteenth mat control signal generation units 101 to 116 is configured to receive mat address signals ADD_mat<0:3> in which addresses having mat information in the address information ADDRESS are pre-decoded. Furthermore, the first to sixteenth mat control signal generation units 101 to 116 receive the first to sixteenth redundancy signals XHITB<0:15>, respectively. For example, the first mat control signal generation unit 101 receives the mat address signals ADD_mat<0:3> and the first redundancy signal XHITB<0>.

The operations of the first to sixteenth mat control signal generation units 101 to 116, which are performed in response to the mat address signals ADD_mat<0:3> and the corresponding redundancy signal XHITB<i>, are identical to each other. Therefore, the operation of the first mat control signal generation unit 101 will be described as a representative example.

When the first redundancy signal XHITB<0> is enabled to a low level, the first mat control signal generation 101 enables a first mat control signal Mat_ctrl regardless of the mat address signals ADD_mat<0:3>.

The semiconductor memory apparatus operating in such a manner includes the 16 mat control signal generation units 101 to 116 to control 16 mats, and each of the mat control signal generation units receives one redundancy signal XHITB<i> and four mat address signals ADD_mat<0:3>.

A problem with conventional semiconductor memory apparatus is inefficency. As the number of mats to be controlled increases, the number of mat control signal generation units increases. Accordingly, the number of signal lines for transferring signals inputted to the mat control signal generation units also increases. Therefore, it is desired to increase the area efficiency of the semiconductor memory apparatus by reducing the number of signals inputted to the mat control signal generation units to decrease the number of signal lines.

SUMMARY

Accordingly, there is a need for an improved semiconductor memory apparatus that may obviate the above-mentioned problem. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

In one exemplary embodiment, a semiconductor memory apparatus may include: a redundancy signal generation unit configured to compare mat information set by fuse cutting with address information inputted from outside and generate a plurality of redundancy signals; a mat designation signal generation unit configured to generate a plurality of mat designation signals in response to the plurality of redundancy signals and a plurality of mat address signals; and a mat control signal generation group configured to enable one of the mat control signals in response to the plurality of mat designation signals.

In another exemplary embodiment, a semiconductor memory apparatus may include: a mat controller configured to output a mat designation signal preset by fuse cutting when address information inputted from outside includes mat information in which a fail occurred, and generate the mat designation signal in response to a mat address signal when the address information does not include mat information in which a fail occurred; and a mat control signal generator configured to enable a mat control signal in response to the mat designation signal.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Figure 1:
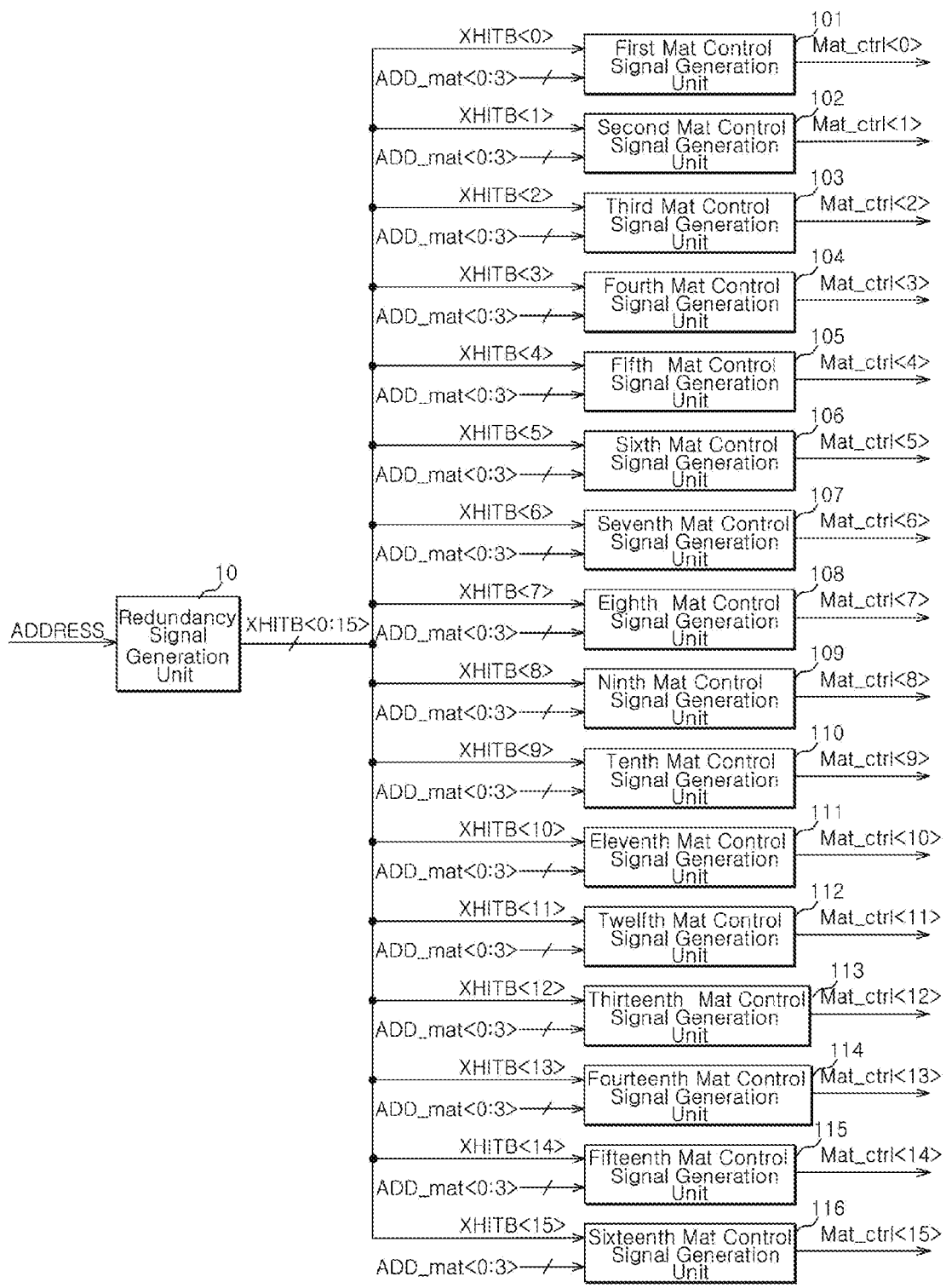
FIG. 1 is a configuration diagram of a conventional semiconductor memory apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
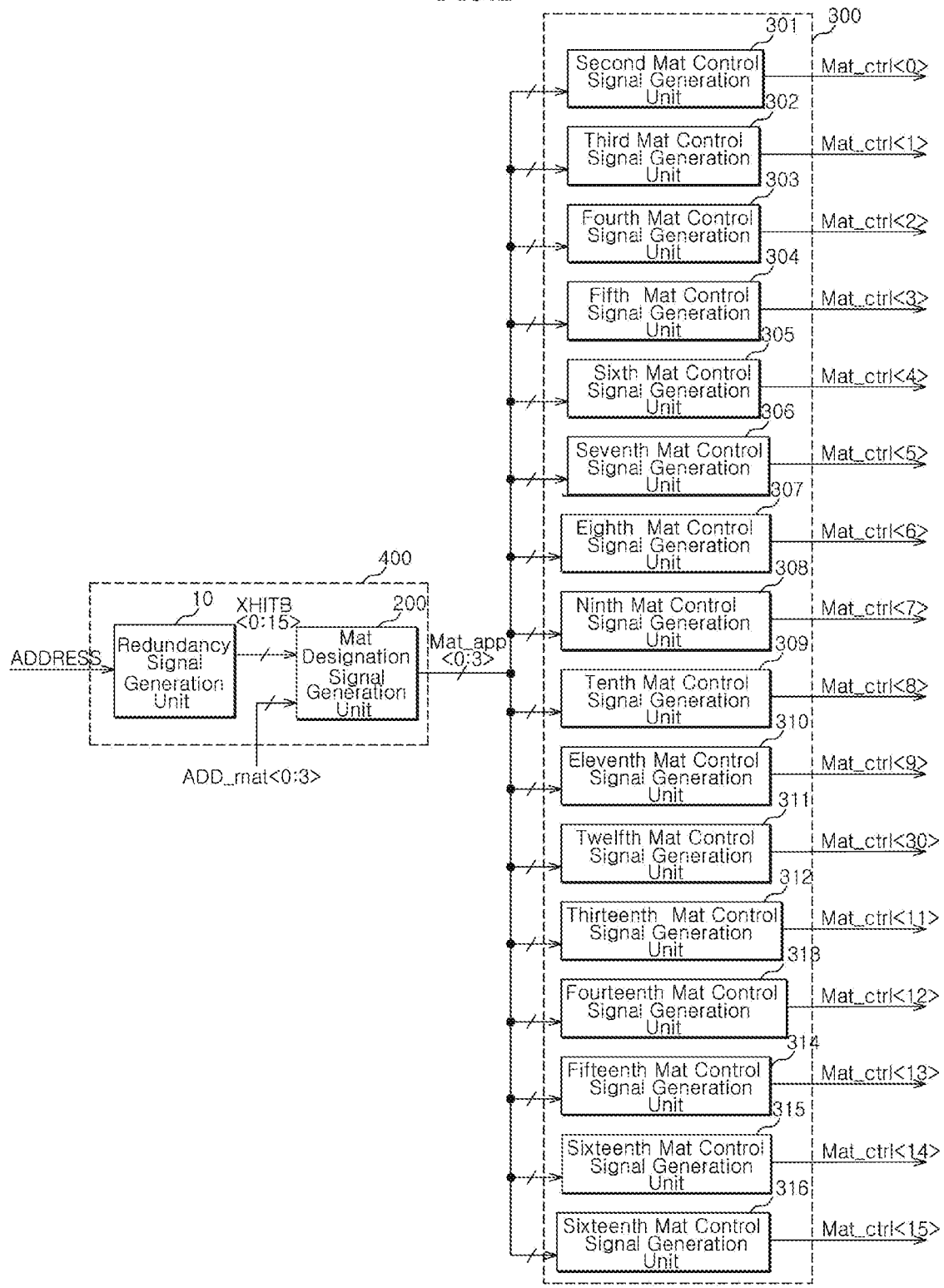
FIG. 2 is a configuration diagram of a semiconductor memory apparatus according to one embodiment.

Referring to FIG. 2, a semiconductor memory apparatus according to one exemplary embodiment may include a mat controller 400 and a mat control signal generation group 300.

The mat controller 400 may be configured to output first to fourth mat designation signals Mat_app<0:3> which may be preset by fuse cutting, when address information ADDRESS inputted from outside includes mat information in which a fail occurred, or generate the first to fourth mat designation signals Mat_app<0:3> in response to first to fourth mat address signals ADD_mat<0:3>, when the address information ADDRESS does not include mat information in which a fail occurred.

The mat controller 400 may include a redundancy signal generation unit 10 and a mat designation signal generation unit 200.

The redundancy signal generation unit 10 may be configured to compare the mat information set by fuse cutting with the address information ADDRESS and generate first to sixteenth redundancy signals XHITB<0:15>. For example, when the address information ADDRESS is identical to the mat information, the redundancy signal generation unit 10 may enable one redundancy signal XHITB<i> of the first to sixteenth redundancy signals XHITB<0:15> to a low level. Furthermore, when the address information is not identical to the mat information, the redundancy signal generation unit 10 may disable all the first to sixteenth redundancy signals XHITB<0:15> to a high level. The redundancy signal generation 10 of FIG. 2 may be configured in the same manner as the redundancy signal generation unit 10 of FIG. 1.

The mat designation signal generation unit 200 may be configured to generate the first to fourth mat designation signals Mat_app<0:3> in response to the first to sixteenth redundancy signals XHITB<0:15> and the first to fourth mat address signals ADD_mat<0:3>. For example, the mat designation signal generation unit 200 may encode the first to sixteenth redundancy signals XHITB<0:15> and generate the first to fourth redundancy encoding signals XHITB<0:3>. When any one of the first to sixteenth redundancy signals XHITB<0:15> is enabled to a low level, the mat designation signal generation unit 200 may output the first to fourth redundancy encoding signals XHITB<0:3> as the first to fourth mat designation signals Mat_app<0:3>. When all the first to sixteenth redundancy signals XHITB<0:15> are disabled to a high level, the mat designation signal generation unit 200 may output the first to fourth mat address signals ADD_mat<0:3> as the first to fourth mat designation signals Mat_app<0:3>.

The mat control signal generation group 300 may be configured to enable one of the first to sixteenth mat control signals Mat_ctrl <0:15> in response to the first to fourth mat designation signals Mat_app<0:3>.

The mat control signal generation group 300 may include first to sixteenth mat control signal generation units 301 to 316.

The first to sixteenth mat control signal generation units 301 to 316 may be configured to commonly receive the first to fourth mat designation signals Mat_app<0:3> and generate first to sixteenth control signals Mat_ctrl<0:15>, respectively, in response to the inputted first to fourth mat designation signals Mat_app<0:3>. For example, the first mat control signal generation unit 301 generates the first mat control signal Mat_ctrl<0> in response to the first to fourth mat designation signals Mat_app<0:3>.

Figure 3:
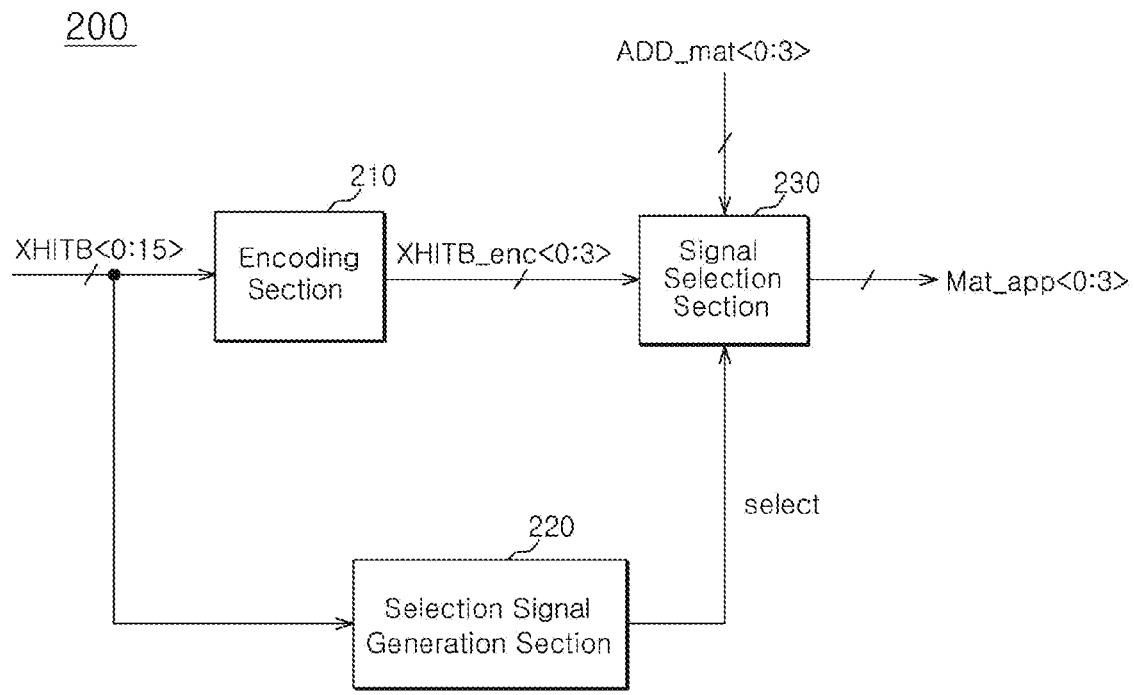
FIG. 3 is a schematic configuration diagram of a mat designation signal generation unit of FIG. 2.

Referring to FIG. 3, the mat designation signal generation unit 200 may include an encoding section 210, a selection signal generation section 220, and a signal selection section 230.

The encoding section 210 may be configured to encode the first to sixteenth redundancy signals XHITB<0:15> and generate the first to fourth redundancy encoding signals XHITB_enc<0:3>.

The selection signal generation section 220 may be configured to enable a selection signal select, when any one of the first to sixteenth redundancy signal XHITB<0:15> is enabled to a low level. Furthermore, the selection signal generation section 220 may be configured to disable the selection signal select when all the first to sixteenth redundancy signals XHITB<0:15> are disabled to a high level.

The signal selection section 230 may be configured to output the first to fourth mat address signals ADD_mat<0:3> or the first to fourth redundancy encoding signals XHITB_enc<0:3> as the first to fourth mat designation signals Mat_app<0:3>, in response to the selection signal select. For example, when the selection signal select is disabled, the signal selection section 230 may output the first to fourth mat address signals ADD_mat<0:3> as the first to fourth mat designation signals Mat_app<0:3>, and when the selection signal select is enabled, the signal selection section 230 may output the first to fourth redundancy encoding signals XHITB_enc<0:3> as the first to fourth mat designation signals Mat_app<0:3>.

Figure 4:
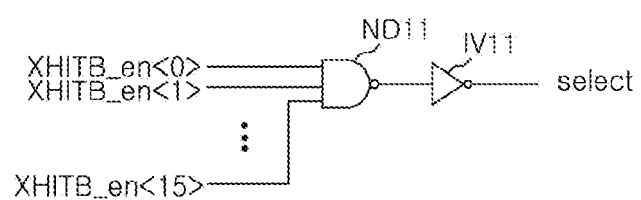
FIG. 4 is a configuration diagram of a selection signal selection section of FIG. 3.

Referring to FIG. 4, the selection signal generation section 220 may include a first NAND gate ND11 and a first inverter IV11. The first NAND gate ND11 may be configured to receive the first to sixteenth redundancy signals XHITB<0:15>. The first inverter IV11 may be configured to invert an output signal of the first NAND gate ND11 and output the inverted signal as the selection signal select.

Figure 5:
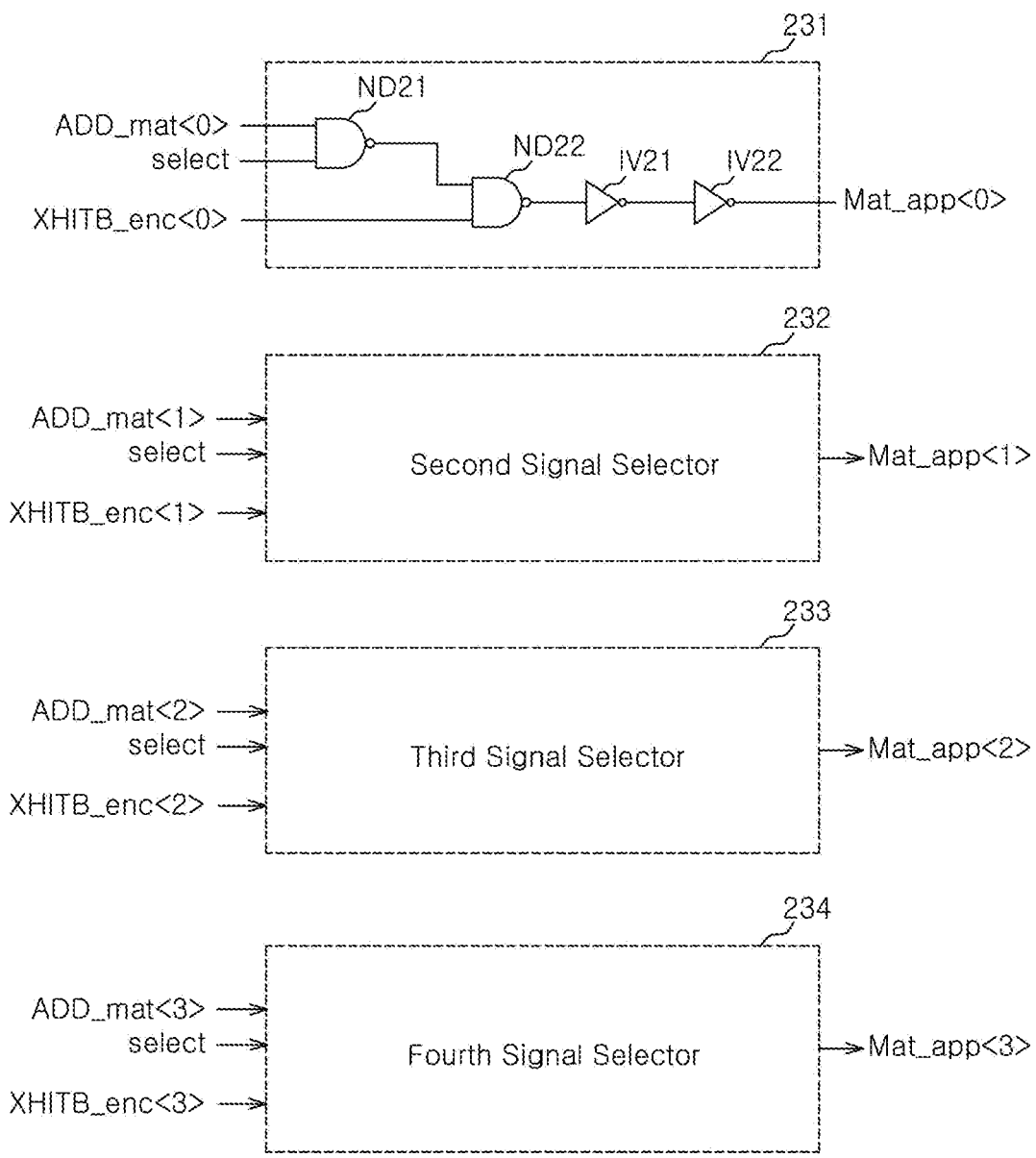
FIG. 5 is a configuration diagram of a signal selection section of FIG. 3.

Referring to FIG. 5, the signal selection section 230 may include the first to fourth signal selectors 231 to 234.

The first signal selector 231 may be configured to output the first mat address signal ADD_mat<0> as the first mat designation signal Mat_app<0> when the selection signal select is disabled, and may output the first redundancy encoding signal XHITB<0> as the first mat designation signal Mat_app<0> when the selection signal select is enabled.

The second signal selector 232 may be configured to output the second mat address signal ADD_mat<1> as the second mat designation signal Mat_app<1> when the selection signal select is disabled, and output the second redundancy encoding signal XHITB<1> as the second mat designation signal Mat_app<1> when the selection signal select is enabled.

The third signal selector 233 may be configured to output the third mat address signal ADD_mat<2> as the third mat designation signal Mat_app<2> when the selection signal select is disabled, and output the third redundancy encoding signal XHITB<2> as the third mat designation signal Mat_app<2> when the selection signal select is enabled.

The fourth signal selector 234 may be configured to output the fourth mat address signal ADD_mat<3> as the fourth mat designation signal Mat_app<3> when the selection signal select is disabled, and output the fourth redundancy encoding signal XHITB<3> as the fourth mat designation signal Mat_app<3> when the selection signal select is enabled.

The configurations of the first to fourth signal selectors 231 to 234 may be identical to one another. The configuration of the first signal selector 231 will be described as a representative example.

The first signal selector 231 may include NAND gates ND21 and ND22 and inverters IV21 and IV22. The NAND gate ND21 may be configured to receive the first mat address signal ADD_mat<0> and the selection signal select. The NAND gate ND22 may be configured to receive an output signal of the second NAND gate ND21 and the first redundancy encoding signal XHITB_enc<0>. The inverter IV21 may be configured to receive an output signal of the NAND gate ND22. The inverter IV22 may be configured to receive an output signal of the inverter IV21 and output the first mat designation signal Mat_app<0>.

Now, the operation of the semiconductor memory apparatus according to an embodiment will be described as follows.

The redundancy signal generation unit 10 may include a plurality of fuse circuits, and mat information may be preset by fuse cutting of the fuse circuits. At this time, mat information on a mat in which a fail occurred may be set in the redundancy signal generation unit 10. Furthermore, the redundancy signal generation unit 10 enables one signal set to the fuse cutting among the first to sixteenth redundancy signals XHITB<0:15> to a low level, when address information ADDRESS inputted from outside is identical to the mat information set by the fuse cutting. Meanwhile, the redundancy signal generation unit 10 may disable all the first to sixteenth redundancy signals XHITB<0:15> to a high level, when the address information ADDRESS is different from the mat information set by the fuse cutting.

The encoding section 210 may encode the first to sixteenth redundancy signals XHITB<0:15> and generate the first to fourth redundancy encoding signals XHITB_enc<0:3>.

The selection signal generation section 220 may enable the selection signal select when any one of the first to sixteenth redundancy signals XHITB<0:15> is enabled, and may disable the selection signal select when all the first to sixteenth redundancy signals XHITB<0:15> are disabled.

The signal selection section 230 may output the first to fourth redundancy encoding signals XHIT_enc<0:3> as the first to fourth mat designation signals Mat_app<0:3> when the selection signal select is enabled, and output the first to fourth mat address signals ADD_mat<0:3> as the first to fourth mat designation signals Mat_app<0:3> when the selection signal select is disabled.

All the first to sixteenth mat control signal generation units 301 to 316 receive the first to fourth mat designation signals Mat_app<0:3>. The first to sixteenth mat control signal generation units 301 to 316 may enable the first to sixteenth mat control signals Mat_ctrl<0:15>, respectively, in response to the first to fourth mat designation signals Mat_app<0:3>. For example, only one of the signals outputted by the first to sixteenth mat control signal generation units 301 to 316, that is, the first to sixteenth mat control signals Mat_ctrl<0:15> may be enabled in response to the first to fourth mat designation signals Mat_app<0:3>.

As such, both the semiconductor memory apparatus of FIG. 2 and the conventional memory apparatus of FIG. 1 may compare the mat information stored in the redundancy signal generation unit 10 with the address information ADDRESS inputted from outside and enables one of the redundancy signals XHITB<0:15> or disables all the redundancy signals XHITB<0:15>. When one of the redundancy signals XHITB<0:15> is enabled, a mat control signal Mat_ctrl<i> corresponding to the enabled redundancy signal may be enabled. Meanwhile, when all the redundancy signals XHITB<0:15> are disabled, the mat control signal Mat_ctrl<i> may be enabled in response to the mat address signals ADD_mat<0:3>. Therefore, in both the semiconductor memory apparatus of FIG. 2 and the conventional semiconductor memory apparatus of FIG. 1, the operation of controlling the mat control signal according to the redundancy information (the mat information preset in the redundancy signal generation unit 10) and the mat address signal may be performed in the same manner. Referring to FIGS. 1 and 2, however, the sixteen mat control signal generation units 101 to 116 of FIG. 1 receive the redundancy information XHITB<i> and the mat address signals ADD_mat<0:3>. The 16 mat control signal generation units 301 to 316 of FIG. 2 may receive the mat designation signals Mat_app<0:3> including the redundancy information XHIT<i> and the mat address signals ADD_mat<0:3>. In other words, the 16 mat control signals generation units 301 to 316 may receive the redundancy information XHIT<i> and the mat address signals ADD_mat<0:3> through the same signal line. Therefore, the semiconductor memory apparatus according to the embodiment may reduce the number of signal lines by 16, compared with the conventional semiconductor memory apparatus of FIG. 1. Accordingly, since the number of signal lines used for the redundancy operation can be reduced, it may be possible to increase the area efficiency of the semiconductor memory apparatus.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a redundancy signal generation unit configured to compare mat information set by fuse cutting with address information inputted from outside and to generate a plurality of redundancy signals;
   a mat designation signal generation unit configured to generate a plurality of mat designation signals in response to the plurality of redundancy signals and a plurality of mat address signals; and
   a mat control signal generation group configured to enable one of the mat control signals in response to the plurality of mat designation signals.

2. The semiconductor memory apparatus according to claim 1, wherein the mat designation signal generation unit comprises:
   an encoding section configured to encode the plurality of redundancy signals and generate a plurality of redundancy encoding signals of which the number is equal to the number of the mat address signals;
   a selection signal generation section configured to enable a selection signal when any one of the plurality of redundancy signals is enabled; and a signal selection section configured to select the mat address signals or output signals of the encoding section in response to the selection signal and output the selected signals as the plurality of mat designation signals.

3. The semiconductor memory apparatus according to claim 2, wherein each one of the plurality of redundancy signals is a signal which is enabled to a low level, and the selection signal generation unit disables the selection signal when each one of the plurality of redundancy signals is at a high level, and enables the selection signal when any one of the plurality of redundancy signals is enabled to a low level.

4. The semiconductor memory apparatus according to claim 3, wherein the signal selection section outputs the plurality of mat address signals as the plurality of mat designation signals when the selection signal is disabled, and outputs the output signals of the encoding section as the plurality of mat designation signals when the selection signal is enabled.

5. The semiconductor memory apparatus according to claim 4, wherein the number of the mat designation signals, the number of the output signals of the encoding section, and the number of the redundancy encoding signals are equal to one another.

6. The semiconductor memory apparatus according to claim 1, wherein the mat control signal generation group comprises a plurality of mat control signal generation sections configured to output a mat control signal and receive the plurality of mat designation signals, respectively.

7. The semiconductor memory apparatus according to claim 6, wherein each of the mat control signal generation sections enables a mat control signal, when preset mat designation information is identical to the plurality of mat designation signals.

8. A semiconductor memory apparatus comprising:

a mat controller configured to output a mat designation signal preset by fuse cutting when address information inputted from outside includes mat information in which a fail occurred, and to generate the mat designation signal in response to a mat address signal when the address information does not include mat information in which a fail occurred; and a mat control signal generator configured to enable a mat control signal in response to the mat designation signal.

9. The semiconductor memory apparatus according to claim 8, wherein the mat controller comprises:

a redundancy signal generation unit configured to enable one of a plurality of redundancy signals when the address information is identical to the mat information set by the fuse cutting, and to disable all of the plurality of redundancy signals when the address information is not identical to the preset mat information; and a mat designation signal generation unit configured to output a redundancy encoding signal obtained by encoding the plurality of redundancy signals as mat designation signals when any one of the plurality of redundancy signals is enabled, and output a mat address signal as the mat designation signal when all of the plurality of redundancy signals are disabled.

10. The semiconductor memory apparatus according to claim 9, wherein the mat designation signal generation unit comprises:

an encoding section configured to encode the plurality of redundancy signals and generate the redundancy encoding signal;

a selection signal generation section configured to enable a selection signal when any one of the plurality of redundancy signals is enabled; and is a signal selection section configured to output the redundancy encoding signal or the mat address signal as the mat designation signal in response to the selection signal.

* * * * *